United States Patent [19]

Beyea et al.

[11] Patent Number: 5,063,174

[45] Date of Patent: Nov. 5, 1991

[54] SI/AU/NI ALLOYED OHMIC CONTACT TO N-GAAS AND FABRICATING PROCESS THEREFOR

[75] Inventors: Dana M. Beyea, Londonderry, N.H.; Kathleen Meehan, Medford, Mass.

[73] Assignee: Polaroid Corporation, Cambridge, Mass.

[21] Appl. No.: 585,015

[22] Filed: Sep. 18, 1990

[51] Int. Cl.$^5$ .......................................... H01L 21/283
[52] U.S. Cl. ............................ 437/184; 148/DIG. 20
[58] Field of Search ............... 437/189, 184, 193, 196; 148/DIG. 19, DIG. 20

[56] References Cited

U.S. PATENT DOCUMENTS

| | | | |
|---|---|---|---|
| 3,214,654 | 10/1965 | Armstrong et al. | 317/237 |
| 3,323,198 | 6/1967 | Shortes | 29/155.5 |
| 4,526,624 | 7/1985 | Tombrello et al. | 148/1.5 |
| 4,583,110 | 4/1986 | Jackson et al. | 357/65 |
| 4,757,369 | 7/1988 | Jackson et al. | 357/63 |
| 4,796,082 | 1/1989 | Murakami et al. | 357/71 |
| 4,853,346 | 8/1989 | Baker et al. | 437/184 |
| 4,894,350 | 1/1990 | Zwicknagl et al. | 437/184 |
| 4,914,499 | 4/1990 | Himoto | 357/67 |

OTHER PUBLICATIONS

"A Review of the Theory and Technology for Ohmic Contacts to Group III-V Compound Semiconductors", by V. L. Rideout, in *Solid-State Electronics*, 1975, vol. 18, p. 541.
"Characteristics of AuGeNi Ohmic Contacts to GaAs", by M. Heiblum et al., in *Solid-State Electronics*, 1982, vol. 25, p. 185.
"Interfacial Reactions of Ni, Si/Ni and Ni/Si Films on (100)GaAs", by H. Iwakuro et al., in *Japanese Journal of Applied Physics*, vol. 29, No. 2, Feb. 1990.
"1/f Noise Measurements for Characterizing Multispot Low-Ohmic Contacts", by L. K. J. Vandamme, in *Journal of Applied Physics*, vol. 47, No. 5, May 1976, p. 2056.
"GaAs Metallization: Some Problems and Trends", by J. M. Woodall et al., *J. Vac. Sci. Technol.*, vol. 19, No. 3, Sep./Oct. 1981, p. 794.

Primary Examiner—Olik Chaudhuri
Assistant Examiner—David E. Graybill
Attorney, Agent, or Firm—Edward S. Roman

[57] ABSTRACT

An improved alloyed ohmic contact to n-type GaAs is provided utilizing a Si-based metallization of Si/Au/Ni and exhibiting low contact resistivity and high thermal stability. An improved process for fabricating the inventive contact is also provided comprising the step of first depositing the Si film on the GaAs substrate, thereby simplifying the fabrication of monolithically integrated devices, particularly advanced electro-optic devices, by incorporating self-aligned Si-based contacts in the process. A further improvement is provided in the use of a lift-off-defined Si layer as a reactive-ion etch mask to serve as the self-aligned contact in the process, thereby eliminating a critical photolithographic step of aligning the contact metallization.

16 Claims, 2 Drawing Sheets

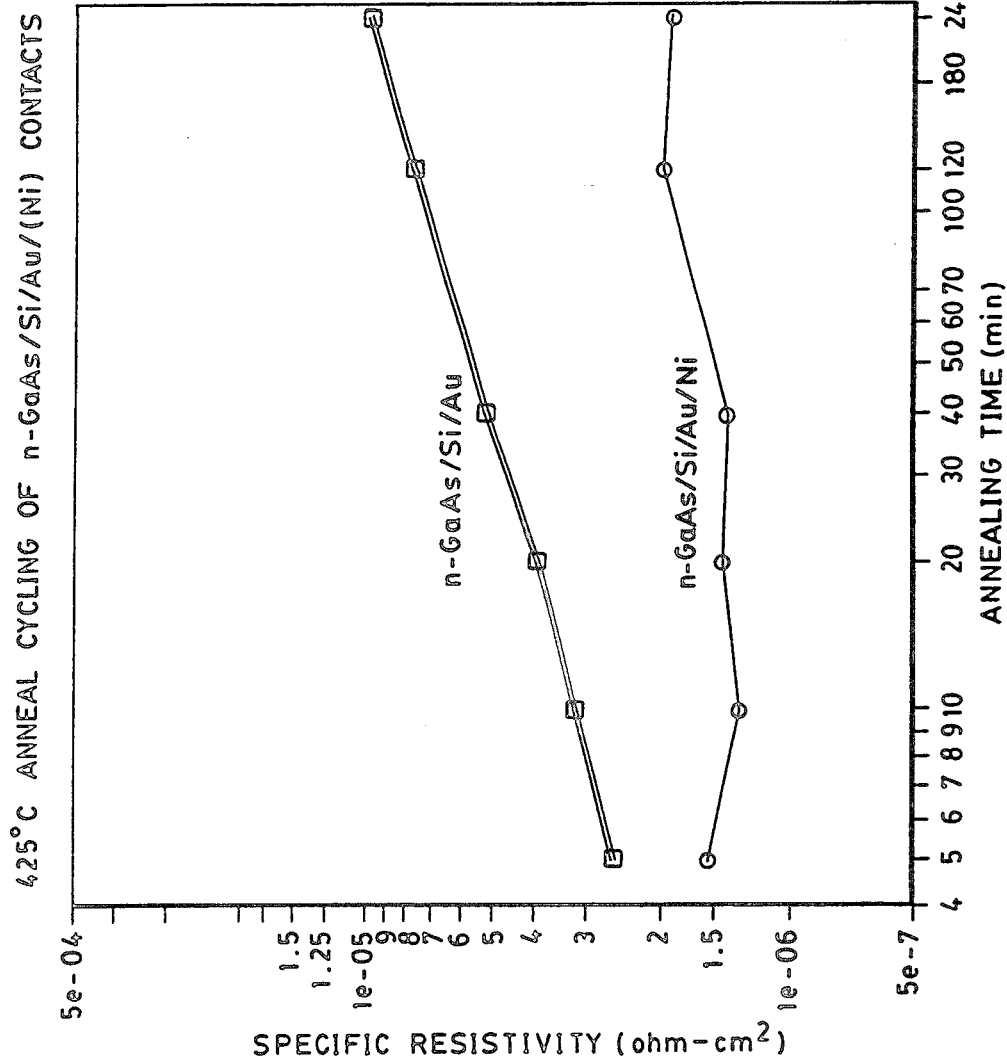

SI/AU/NI ALLOYED OHMIC CONTACT TO N-GAAS AND FABRICATING PROCESS THEREFOR

DESCRIPTION

1. Field of the Invention

The present invention relates to the use of Si films in the fabrication of III-V semiconductor devices. In particular, the invention relates to the fabrication of ohmic contacts by the application of Si-based metallization layers to n-type GaAs substrates. More particularly, the invention relates to the fabrication of Si/Au/Ni alloyed ohmic contacts to n-type GaAs.

2. Description of the Prior Art

Early developments in solid-state electronics were made with compound materials, e.g., PbS crystal detectors. These compound materials comprised a class of crystalline solids intermediate in electrical conductivity between a conductor and an insulator, hence the name "semiconductors." Unlike the electrical resistivity of pure metallic conductors, it was found that the electrical resistivity of most insulating materials and semiconductors decreased with increasing temperature. In addition, semiconductor materials often showed some decrease in resistivity when illuminated with light, i.e., photoconductivity. Such materials can be treated chemically to transmit and control an electric current and may serve as a rectifier, amplifier, switch, light detector or emitter. Rapid developments in techniques for fabrication and application of semiconductor devices since the 1960s has fueled the explosive growth of the electronics industry in the U.S., Japan and elswhere.

Although prior art semiconductors most commonly employ the elements Si and Ge, listed in Group IV of the Periodic Table, other materials, such as intermetallic compounds, have also been found to exhibit useful semiconductor properties.

Intermetallic compound materials used in semiconductor devices comprise substances containing two or more elemental semiconductors in a fixed ratio. Binary compounds contain two elemental semiconductors in a 1:1 ratio. The most useful binary compounds average 4 valence electrons per atom and can usually be obtained from 1:1 combinations of Group III elements (B, Al, Ga, In, Tl) and Group V elements (P, As, Sb, Bi) or Group II elements (Be, Mg, Zn, Cd) and Group VI elements (S, Se, Te).

Semiconductor materials such as Si and Ge are crystalline solids, with their atoms arranged in an orderly lattice structure and each bearing 4 outer, or valence, electrons. Each atom in the lattice forms an electron-pair (covalent) bond with each of its 4 closest neighbors and is, therefore, tightly locked in the lattice structure. When the material exhibits a high degree of chemical purity, i.e., a ratio of impurities of about one part in $10^{12}$, its conductivity is poor and largely temperature dependent. In this state the semiconductor material is regarded as "intrinsic." "Doping" of the semiconductor material by the addition of very small amounts of impurities, usually to a concentration of one part in $10^6$, disrupts the orderly arrangement of the lattice structure and alters the electrical properties to produce much greater conductivity. In this state the semiconductor material is regarded as "extrinsic."

Doping can be done in one of two ways: n-type or p-type doping. In n-type doping of Si or Ge, atoms of Group V are introduced into the semiconductor material resulting in 4 of the 5 valence electrons fitting into the prevailing lattice pattern with one valence electron being much less tightly bound and, therefore, more easily stripped away when an electron potential is applied across the material. In p-type doping of Si or Ge, atoms of Group III are introduced into the lattice structure with one "hole" resulting from the missing valence electron. Conventionally, these holes are treated as mobile particles, like electrons but of opposite polarity, and serve to increase the ability of the semiconductor material to conduct electric current. When a change in doping occurs over a short distance within a single crystal structure, a p-n junction is produced, the p-region being characterized by an excess of holes and the n-region being characterized by an excess of electrons. The p-n junction itself contains no free-charge carriers, i.e., no excess holes or electrons. The junction, therefore, acts as a dielectric or electrical insulator.

Intermetallic compound materials such as GaAs have crystal structures somewhat similar to Si and Ge and exhibit similar electrical characteristics. Doping is generally accomplished using atoms of Group VI to produce n-type semiconductors or atoms of Group II to produce p-type semiconductors. The Group VI atoms act as donors providing an excess of negative charges while the Group II atoms act as acceptors providing a deficiency of negative charges, thereby creating holes. Group IV elements such as Si and Sn can also behave as n-type dopants by occupying Ga sites in the GaAs crystal. While intrinsic compound materials such as GaAs can be made extrinsic by doping, other techniques are also known, e.g., changing the compound ratio. It is also known that some compound materials exhibit very different electrical properties from elemental Si and Ge. The greater carrier mobility of GaAs, in comparison to Si and Ge, translates into very fast switching and high frequency devices, of which transistors, mixers, and tunnel diodes are examples. The energy gap of Si is indirect in comparison to GaAs which is direct so that light is emitted from GaAs when a transition is made from the conduction band to the valence band across the energy gap. This is the inverse of photoconductivity, and GaAs and other compound semiconductors are thus useful for the fabrication of detectors and laser diodes. In addition, the bandgap of GaAs can be modified by the addition of Al(AlGaAs) or In (InGaAs) so that the light emitted will be of a different wavelength than that of GaAs. The major driving force for ohmic contact technology is for large scale integration which requires low resistance, dimensional stability and stability under high temperature processing. The advantageous characteristics exhibited by intermetallic compound materials make them a prime candidate for consideration as ohmic contacts and the present state of the art shows them to be receiving a great deal of attention.

Rideout (Solid State Electronics, 1975, Vol. 18, p. 546) in reviewing the theory and technology for ohmic contacts to Group III-V compound semiconductors points to n-type GaAs as the most commercially important III-V semiconductor. Rideout states that two of the more popular and reliable contact processes for n-type GaAs involve deposition by alloying with Au/Ge and Au/Te and that while one might anticipate that Au/Si would offer a lower resistance contact to n-type GaAs than Au/Ge, thus far this has not proven to be the case.

Heiblum et al. (Solid State Electronics, 1982, Vol. 25, p. 185) studied Au/Ge/Ni ohmic contacts to n-type molecular beam epitaxy (MBE) grown GaAs epitaxial layers and discloses evidence for a high resistivity layer under the contact at least several thousand angstroms deep, which dominates the contact resistance in most cases. Heiblum et al. point out that the individual diffusion of Au, Ge, and Ni is drastically changed when they coexist on the GaAs wafer. For example, they note that Au requires 12 minutes at 500° C. to completely penetrate into GaAs, while Au/Ge is consumed after only one minute at 450° C. and that Ge does not diffuse deeply in a heating process, while Ge in the presence of Ni diffuse together to a few thousand angstroms.

Jackson et al. (I) (U.S. Pat. No. 4,583,110 issued Apr. 15, 1986) point out that ohmic contacts involve barriers to carrier flow that are inherent in the device technology and which introduce resistance that significantly inhibits device performance. In this regard, Jackson et al. (I) note that prior art alloying operations involving Au and Ge to n-type GaAs were attempts to overcome these impediments but resulted in problems associated with thermal stability and reproducability. The invention disclosed by Jackson et al. (I) achieves a useful contact resistance for purposes of circuit design by fabricating an ohmic contact to GaAs wherein the barrier region contains an amphoteric dopant, e.g., Si or Ge, on both donor and acceptor sites in different crystal sublattices such that the net donor density of the barrier region is higher than that of the bulk of the crystal. The inventive feature claimed by Jackson et al (I) resides in providing a net donor concentration of $7 \times 10^{19}$/cc over a short distance so that a barrier width of 30 angstroms is achieved and is accomplished using the technique of MBE.

Jackson et al. (II) (U.S. Pat. No. 4,757,369 issued July 12, 1988) teach MBE fabrication of an ohmic contact to n-GaAs by applying a preferred amphoteric dopant layer of Si on the substrate and then adding As to the Si layer. Upon heating, the As is said to diffuse into the GaAs crystal onto donor Ga sublattice sites thus reducing the depletion width of the barrier at the surface to less than 100 angstroms permitting a tunneling ohmic contact. The inventive contacts are said to have improved temperature stability and the personalization advantage permitting fabrication with reduced subsequent processing.

Iwakuro et al. (Japanese Journal of Applied Physics, Vol. 29, No. 2, Feb. 1990) investigated interfacial reactions of Ni, Si/Ni and Ni/Si films on (100)GaAs by X-ray photoelectron spectroscopy. Observations led to the finding that the interfacial reaction at the GaAs substrate in the Ni/Si/GaAs system was the most stable in the three systems and that the chemical reaction of the Si/Ni film on GaAs was different from that of the Ni/Si film on GaAs. On the other hand, it was found that annealing in the Ni/Si/GaAs system produced intermixing at the Ni/Si interface and hardly any interfacial reaction at the GaAs substrate. It was further found that in both the Si/Ni/GaAs and Ni/Si/GaAs systems the Ga and As atoms did not out-diffuse to the surface, unlike in the Ni/GaAs system. This fact was attributed to the formation of Ni silicides which came in contact with GaAs during annealing and which play a role as a barrier film in preventing out-diffusion of the Ga and As atoms from the Ni/GaAs interface. The result was contrasted with that obtained in the 450° C. annealed Si/Pt/GaAs system in which large amounts of Ga and As atoms out-diffused to the surface.

It is clear from the aforementioned discussion of the prior art that the advantageous characteristics associated with Group III-V intermetallic compound semiconductors, particularly n-type GaAs, are well-known. It is also clear that a variety of techniques are available for fabricating ohmic contacts to n-type GaAs which are resistant to out-diffusion of Ga and As atoms from the contact-GaAs interface. However, the prior art is deficient in that it fails to teach specific techniques for fabricating improved ohmic contacts to n-type GaAs, particularly for use in the design and fabrication of electro-optic devices.

As disclosed herein, we have found that contact schemes with a Si film deposited first can simplify the fabrication of monolithically integrated devices by incorporating self-aligned Si-based contacts in the fabrication process and can permit the fabrication of ohmic contacts to n-type GaAs without intermetallic spikes into the substrate.

SUMMARY OF THE INVENTION

The invention comprises an improved alloyed ohmic contact to n-type GaAs utilizing a Si-based metallization of Si/Au/Ni and exhibiting low contact resistivity ($1.5 \times 10^{-6}$ ohm-cm$^2$) and stability for high temperature processing. The invention also comprises an improved process for fabricating the inventive contact comprising the step of first depositing the Si film on the n-type GaAs, thereby simplifying the fabrication of monolithically integrated devices, particularly advanced electro-optic devices, by incorporating self-aligned Si-based contacts in the fabrication process. The invention also contemplates the use of a lift-off-defined Si layer as a reactive-ion etch mask to serve as the self-aligned contact in the fabrication process, thereby eliminating a critical photolithographic step of aligning the contact metallization. The silicon can also serve as a diffusion source to dope the substrate. The remaining contact metal, Au/Ni, is deposited at a later step. Practice of the process results in the consumption of a limited amount of substrate during alloy (100nm).

OBJECTS OF THE INVENTION

Accordingly, a principal object of the invention is to provide an improved ohmic contact to n-type GaAs utilizing a Si-based contact metallization of Si/Au/Ni and characterized by low contact resistivity and high thermal stability.

Another object of the invention is to provide an improved process for fabricating a Si/Au/Ni alloyed ohmic contact to n-type GaAs characterized by first depositing the Si film on the n-type GaAs, thereby simplifying the fabrication of monolithically integrated devices by incorporating self-aligned Si-based contacts in the fabrication process.

A further object of the invention is to provide an improved process for fabricating a Si/Au/Ni alloyed ohmic contact to n-type GaAs characterized by employing Si early in the process as an etch mask and Si later in the process as a part of the device as an ohmic contact.

Other objects and advantages of the invention will be apparent to those skilled in the art upon reference to the following detailed description taken in conjunction with the appended drawings.

DETAILED DESCRIPTION OF THE INVENTION

Figure 1A:
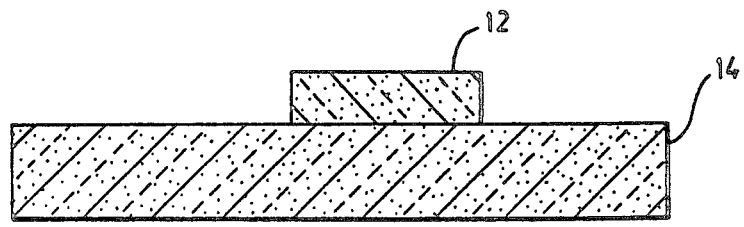
FIGS. 1A–1C are a series of schematic sectional views depicting sequential steps in the inventive fabrication process wherein Si is used as an etch mask.
Figure 1B:
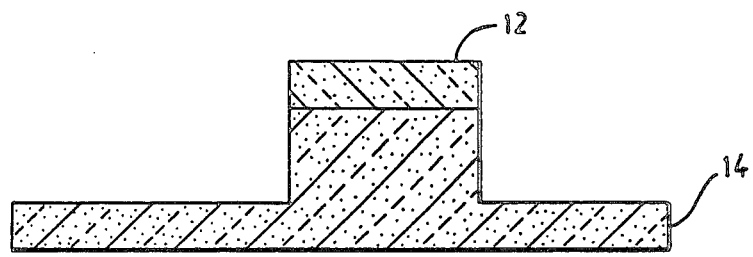
Figure 1C:
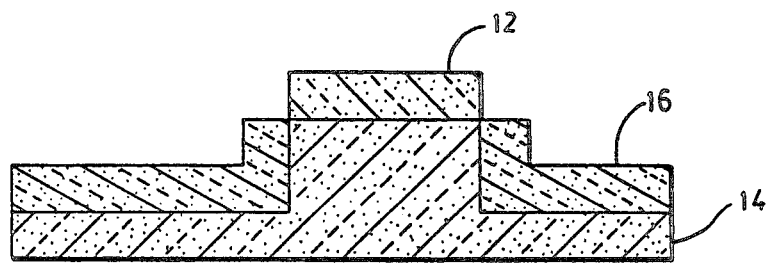

Referring to FIGS. 1A–1C, there is shown the use of a layer of Si in the process sequence of this invention where the Si is employed first as an etch mask, then later in the process as an incorporated part of the device as an ohmic contact.

Referring to FIG. 1, there is shown a Si layer 12 alone patterned or deposited on the surface of a GaAs wafer 14 by a process sequence known in the art as "Lift-off."

FIG. 1B shows the wafer 14 of FIG. 1A after it is exposed to a Reactive Ion Etching (RIE) process. This process etches the substrate material wherever there is no Si acting as an etch mask. Other etch processes may be utilized for purposes of the invention.

FIG. 1C shows the wafer 14 of FIG. IB wherein the exposed areas are selectively passivated with a layer 16 by anodic oxidation. The passivation layer 16 is aligned on the wafer by the Si etch mask layer 12.

A non-critical alignment "Lift-off" process is thereafter performed to add Au and Ni to the Si layer 12. The wafer is then heat treated so that the discrete layers of Si, Au and Ni react with each other and the GaAs substrate to form the ohmic contact of this invention in a manner as to be subsequently described.

Figure 2:
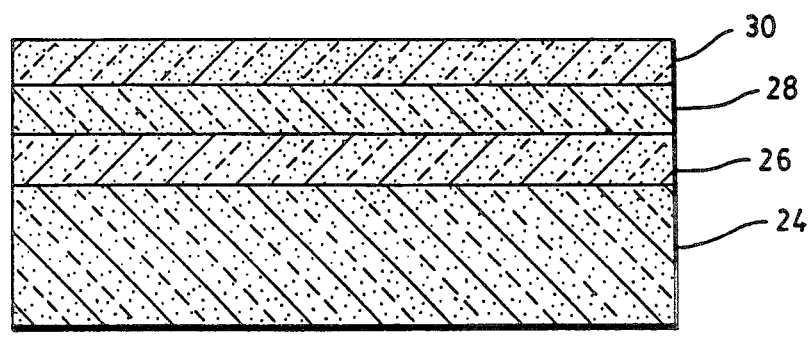
FIG. 2 is a schematic sectional view showing the various layers of the Si/Au/Ni ohmic contact of this invention; and, FIG. 3 is a graph illustrating the variation of specific contact resistivity with annealing time for Si/Au and Si/Au/Ni alloyed ohmic contacts to n-type GaAs.

A preferred embodiment of the invention is now described for the ohmic contact of this invention as applied to a GaAs wafer or substrate as shown at 24 in FIG. 2. The GaAs semiconductor wafer 24 is doped with an n-type dopant having a carrier concentration, Nd, equal to $2.0 \times 10^{18}$/cc. The native oxide on the surface of the GaAs wafer 24 is removed with a dilute solution of HCl acid (10:1 HCl: deionized $H_2O$ for 60 seconds). The wafer 24 is then rinsed with deionized $H_2O$ and dried with $N_2$ gas. Next the wafer 24 is loaded into the load-lock of an electron beam evaporator (EBeam) and the chamber was evacuated to $7 \times 10$; Torr. A single layer 26 of Si is evaporated onto the surface of the GaAs wafer 24, the Si layer 26 being of high purity, marz grade, 100 nm thick. As will be readily understood after application of the Si layer 26, the wafer could be selectively ion etched and passivated in the manner as described in reference to FIGS. 1A–1C. However, for this example the vacuum is maintained, and a single layer 28 of Au is evaporated on top of the Si layer 26, the Au layer 28 being of high purity, marz grade, 250 nm thick. Without breaking vacuum, a single layer 30 of Ni is evaporated on top of the Au layer 28, the Ni being of high purity, marz grade, 100 nm thick. The coated wafer is then unloaded from the electron beam evaporator and annealed in an open tube furnace at 425° C. for 5 minutes in a $N_2$ atmosphere.

While a bulk GaAs wafer is employed in the aforementioned procedure, this is not a critical feature of the invention. The invention may be practiced using a semi-insulating wafer doped n-type by ion implantation, or an epitaxial layer of GaAs grown by MBE, MOCVD, LPE, or VPE as taught in the art. The technique employed for removing native oxide from the wafer is an industry standard and provides an oxide free interface between the GaAs and the first metal layer. The employment of an electron beam evaporator is not intended as a limitation, as the invention contemplates evaporation of the metal layers by other physical deposition systems, including a thermal evaporator or a sputter deposition system. Additional techniques for depositing the Si film can include a plasma or thermal deposition process using silane ($SiH_4$). Similarly, in the case of thermal annealing to form the contact, other heating methods known in the art, such as lasers, lamps or carbon strip heaters, may be utilized.

The order of deposition of the metal layers, 26, 28, 30, however, is critical. As described, the layers 26, 28, 30, are deposited on the surface of the GaAs substrate 24 in this order: Si, first; Au, second; Ni, third. The discrete layers 26, 28, 30, are heated, and react with each other and the GaAs substrate 24 to form the ohmic contact. When the Si/Au/Ni layers 26, 28, 30 are heat treated at temperatures above 375° C., a melt is formed and the discrete layers of Si, Au, and Ni, interdiffuse with one another allowing Au and Ni to reach the GaAs substrate 24. The Au reacts with the substrate forming intermetallic phases of Au/Ga freeing up Ga sites for the amphoteric dopant, Si, to occupy. The Ni is believed to increase the solubility of the GaAs enhancing the indiffusion of the amphoteric dopant. Thus, the addition of the Ni operates to more evenly distribute the intermetallic components formed, lowering the contact resistivity by allowing more vacated Ga sites to be occupied by Si.

The layer thicknesses for the Si and the Au are selected to obtain 6 weight percent Si in Au. This ratio is selected based on the teaching of Hansen et al. (Constitution of Binary Alloys, 2nd Edition, 1958, p. 232) because a low temperature eutectic is formed at 370° C. The Ni layer thickness is selected based on the smoothness of the contact after heat treating. Ni layer thickness in the order of 100 nm is determined to yield the best surface morphology. The order that the layers are deposited is also determined to be significant. If the Au is deposited first, i.e., Au/Si/Ni instead of Si/Au/Ni, the measured contact resistivity is higher after heat treating, and the contact resistivity degrades when repeated thermal cycles from room temperature to 425° C. are performed. The Si/Au/Ni contact does not exhibit this degradation behavior. For the purpose of gauging the penetration depth of the contacts, a scanning electron microscope (SEM) study was made of the interface between the alloyed contacts and the GaAs substrate, following the removal of the substrate. The analysis of the Si/Au/Ni contact interface reveals evenly spaced and sized intermetallic structures on the order of 100 nm in depth and 50–500 nm in width. A Si/Au contact which does not include the Ni layer by contrast shows nonuniformly distributed intermetallic structures with the largest penetrating more than 1.25 um into the substrate.

In FIG. 3, the thermal stability of the Si/Au/Ni contacts to n-type GaAs of this invention is compared graphically to Si/Au contacts. The graph shows a log-log plot of contact resistivity in ohm-$cm^2$ versus annealing time in minutes for both contacts. It can be seen that the specific contact resistivity of the Si/Au contacts degrade steadily with each thermal cycle between room temperature and 425° C. No such degradation is observed for the Si/Au/Ni contacts, their specific contact retentivities remaining level over the 4 hour period.

It is to be understood that the aforedescribed embodiments of the invention are merely illustrative of the principles of the invention and that numerous other arrangements and modifications may be derived from those skilled in the art without departing from the spirit and scope of the invention as defined by the appended claims.

What is claimed is:

1. A process for fabricating a Si/Au/Ni alloyed ohmic contact to n-type GaAs substrate comprising the steps of:
    depositing a Si layer on the n-type GaAs substrate;
    depositing a Au layer on the Si layer;
    depositing a Ni layer on the Au layer; and
    thermally annealing the GaAs substrate with its deposited Si, Au and Ni layers thereon for sufficient time to allow the Si, Au and Ni layers to interdiffuse with one another so that the Au and Ni reach the GaAs substrate.

2. The process of claim 1 wherein the Si layer is deposited in a manner such that the Si layer defines an etch mask and there is further included the step of etching the GaAs substrate after the Si layer is deposited.

3. The process of claim 2 including the step of passivating the GaAs substrate after said etching step.

4. The process of claim 1 wherein the GaAs substrate is a bulk GaAs wafer or a semi-insulating wafer doped n-type by ion implantation or an epitaxial layer of GaAs grown by MBE, MOCVD, LPE or VPE.

5. The process of claim 1 wherein the GaAs substrate includes an oxide coating thereon and there is further included the step of removing the oxide coating from the surface of the GaAs substrate prior to deposition of the Si layer.

6. The process of claim 1 wherein the thickness of the Si and Au layers are selected to provide substantially 6 weight percent Si in Au after thermal annealing.

7. The process of claim 6 wherein the Si layer is deposited to a thickness in the order of 100 nm, the Au layer is deposited to a thickness in the order of 250 nm, and the Ni is deposited to a thickness in the range of 30 nm to 100 nm.

8. The process of claim 1 wherein the deposition of the Si, Au and Ni layers is a process selected from a group consisting of electron beam evaporation, thermal evaporation, sputtering, and thermal deposition using silane.

9. The process of claim 4 wherein the step of thermal annealing is accomplished by using an open tube furnace or lasers, or lamps or carbon strip heaters.

10. The process of claim 8 wherein the step of thermal annealing is conducted at a temperature of substantially 425° C. for a period of substantially 5 minutes in an inert atmosphere.

11. In a process for fabricating a semiconductor device, the improvement comprising employing Si in the process as an etch mask and thereafter utilizing the Si previously used as an etch mask in the process as a part of a Si/Au/Ni ohmic contact to GaAs in the device.

12. A process for fabricating an improved ohmic contact to n-type GaAs comprising the steps of acquiring a GaAs semiconductor substrate doped n-type, removing native oxide from the substrate surface, rinsing and drying said substrate, evaporating a single layer of Si substantially 100 nm thick onto the substrate surface, evaporating a single layer of Au substantially 250 nm thick on top of the Si layer, evaporating a single layer of Ni substantially 100 nm thick on top of the Au layer, and annealing the coated substrate.

13. The process according to claim 12 wherein the annealing step is carried out at a temperature of about 425° C. for a period of about 5 minutes in an inert atmosphere.

14. A process for fabricating an improved ohmic contact to n-type GaAs comprising the steps of depositing a Si layer on the surface of an n-type GaAs semiconductor substrate in a select pattern leaving exposed areas of the substrate surface, etching the exposed areas of the substrate surface, selectively passivating the etched areas of the substrate, performing a non-critical alignment process to sequentially add Au and Ni to the Si layer and thereafter heat treating to alloy the discrete layers with the substrate to form an ohmic contact.

15. The process according to claim 14 wherein etching is carried out by a reactive ion etching (RIE) process.

16. The process according to claim 14 wherein selective passivation is carried out by anodic oxidation.

* * * * *